(12) United States Patent
Takahashi et al.

(10) Patent No.: US 7,145,830 B2
(45) Date of Patent: *Dec. 5, 2006

(54) SEMICONDUCTOR MEMORY DEVICE

(75) Inventors: Hiroyuki Takahashi, Kanagawa (JP);
Atsushi Nakagawa, Kanagawa (JP);
Hideo Inaba, Kanagawa (JP)

(73) Assignee: NEC Electronics Corporation,
Kanagawa (JP)

( * ) Notice: Subject to any disclaimer, the term of this patent is extended or adjusted under 35 U.S.C. 154(b) by 1 day.

This patent is subject to a terminal disclaimer.

(21) Appl. No.: 11/130,464

(22) Filed: May 16, 2005

(65) Prior Publication Data

US 2005/0207214 A1    Sep. 22, 2005

Related U.S. Application Data

(60) Division of application No. 10/479,729, filed on Dec. 5, 2003, now Pat. No. 6,922,371, which is a continuation of application No. PCT/JP02/05169, filed on May 28, 2002.

(30) Foreign Application Priority Data

Jun. 5, 2001   (JP)   ............................. 2001-170184

(51) Int. Cl.
*G11C 5/14*    (2006.01)

(52) U.S. Cl. ...................................................... 365/227
(58) Field of Classification Search ................ 365/227, 365/226, 222
See application file for complete search history.

(56) References Cited

U.S. PATENT DOCUMENTS 5,689,460 A * 11/1997 Ooishi ................... 365/189.07

* cited by examiner

*Primary Examiner*—Vu A. Le
(74) *Attorney, Agent, or Firm*—Muirhead & Saturnelli, LLC

(57) ABSTRACT

A semiconductor memory device is provided which effectively reduces a consumption of current of a system of circuits associated with refresh operations. A control signal circuit 2 controls n-channel transistors 3C, 4B to be in an OFF-state based on an internal chip select signal SCI in an interval time period between the refresh operations, wherein the n-channel transistors 3C, 4B are connected between the system of circuits associated with refresh operations (an internal voltage-down circuit 3 and a boost circuit 4) and the ground, so as to break down a leak path of the system of circuits associated with refresh operations for reducing the leakage of current. At a timing of starting the refresh operation by triggering a timer, the internal chip select signal SCI is transitioned to a high level for supplying a ground voltage to the internal voltage-down circuit 3 and the boost circuit 4.

8 Claims, 11 Drawing Sheets

FIG.3
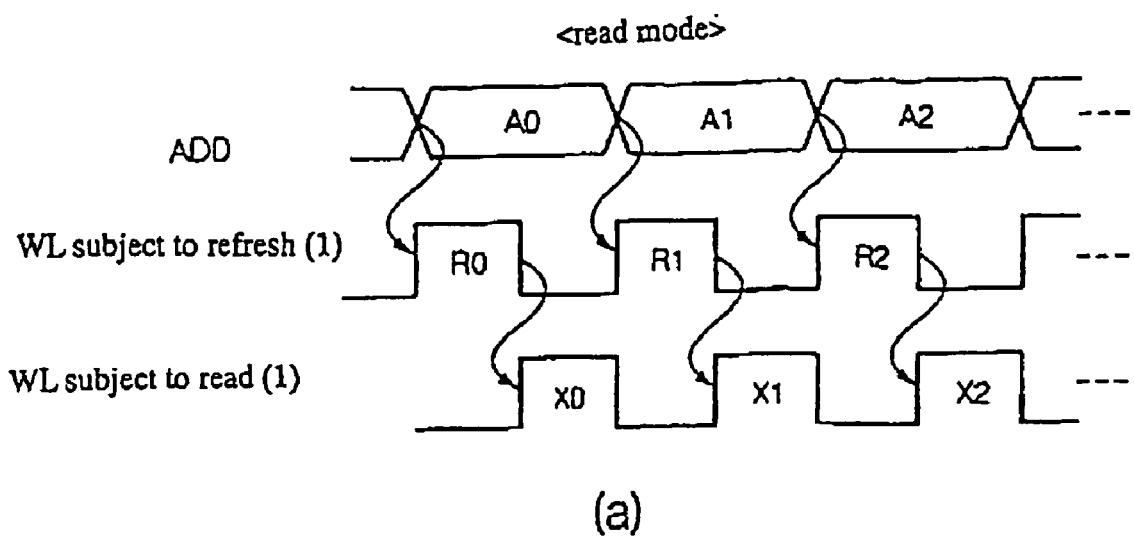
(a)
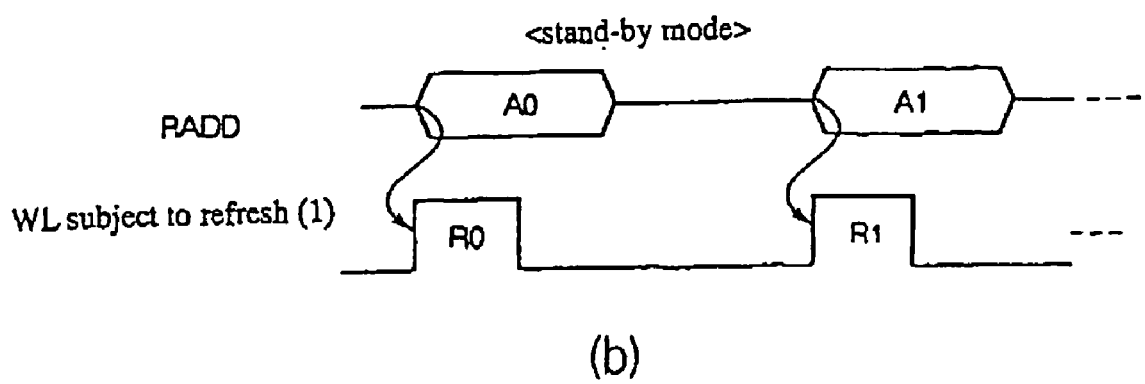
(b)

SEMICONDUCTOR MEMORY DEVICE

CROSS-REFERENCE TO RELATED APPLICATIONS

The present application is a divisional of U.S. patent application Ser. No. 10/479,729, filed Dec. 5, 2003, now U.S. Pat. No. 6,922,371, which is a continuation of PCT/JP02/05169 filed May 28, 2002.

TECHNICAL FIELD

The present invention relates to a semiconductor memory device which needs a refresh operation for stored data, and more particularly to a technique for reducing a consumption of current by a system of circuits associated with refresh operation.

BACKGROUND ART

A pseudo-SRAM has conventionally been utilized for a portable device, wherein the pseudo-SRAM has both an advantage of a DRAM (Dynamic Random Access Memory) suitable for a large capacity and another advantage of an SRAM (Static Random Access Memory) making it easy to design timings. In the field of this type, requests for scaling down the device and for improving long life-time of a battery have been on the increase year by year. The pseudo-SRAM comprises a basic structure of DRAM, wherein a power consumption thereof is not necessarily small as compared to the general-purpose SRAM, for which reason it had been desired to realize a further reduction in the power consumption of the pseudo-SRAM.

An example of the conventional technique for reducing the current consumption will, hereinafter, be described.

FIG. 1 shows an example of a circuit for reducing the consumption of current in accordance with the prior art. In this example, the circuit is configured in order to suppress the consumption of current by an operating circuit 501 in a stand-by state, wherein an n-channel MOS transistor (hereinafter referred to as n-channel transistor) 502 to be controlled into an OFF-state in a stand-by state is inserted into between the operating circuit 501 and a ground, while a power VDD is directly supplied to the operating circuit 501, wherein a voltage reduction is made thereto for suppressing an operating current.

A chip select signal CS is supplied to a gate of an n-channel transistor 502. The chip select signal CS is a control signal for switch between the stand-by mode and an active mode. A low level of this signal places the semiconductor memory device integrating the operating circuit 501 into the stand-by state.

The operating circuit 501 comprises basic gate circuits such as inverters and NAND-gates comprising CMOS (Complimentary Metal Oxide Semiconductor). Gate threshold voltages of an n-channel transistor and a p-channel MOS transistor (hereinafter referred to as p-channel transistor) are set relatively low in response to the reduced voltage level of the power VDD. In contrast, a gate threshold voltage of the n-channel transistor 502 is set relatively high in consideration of a sub-threshold current which provides a leakage of current.

In accordance with this configuration, in the active state, the chip select signal CS is in the high level to place the n-channel transistor 502 in the ON-state, whereby the ground voltage is supplied through this transistor 502 to the operating circuit 501, and thus the operating circuit 501 is in the operable state. Since the gate threshold voltages of the n-channel and p-channel transistors of the operating circuit 501 are set low, the operating circuit 501 shows a high speed switching operation even by the reduced voltage of the power VDD.

In contrast, in the stand-by state, the chip select signal CS is in the low level, thereby placing the n-channel transistor 502 into the OFF-state. Since the gate threshold voltage of the n-channel transistor 502 is set high, the sub-threshold current of this n-channel transistor 502 is effectively suppressed, thereby suppressing effectively a leakage of current flowing through the operating circuit 501 in the stand-by state. Since the gate threshold voltage of the n-channel transistor 502 is set high, the n-channel transistor 502 shows a delayed switching operation. In the active state, the n-channel transistor 502 is placed in the ON-state, so that the n-channel transistor 502 does not disturb the switching operation by the operating circuit 501.

The voltage reduction to the power VDD for the operating circuit 501 and the low gate threshold voltage of the transistors of the operating circuit 501 render compatible both the reduction to the operating current and the high speed operation in the active anode. Supplying the ground voltage through the n-channel transistor 502 having the high gate threshold voltage to the operating circuit 501 reduces the leakage of current of the operating circuit 501 in the stand-by mode.

Meanwhile, the above-described pseudo-SRAM has memory cells configured similarly to the DRAM, for which reason independently from the operating modes, cyclic refresh operations for data stored in memory cells are necessary. In the pseudo-SRAM, a system of circuits associated with the refresh operation remains always activated independently from the operating modes. This causes increasing the consumption of power of the pseudo-SRAM. Particularly, there is a problem with a remarkable leakage of current as an unnecessary consumption of current in an interval of time period (between refresh operations) which is much longer than a time necessary for cyclic executions of refresh operations.

The above-described prior art is applicable to a system of circuits inactivated in the stand-by mode but not applicable to another system of circuits which may be activated in the stand-by mode such as the system of circuits associated with the refresh in the pseudo-SRAM, wherein any effective reduction to the stand-by state can not be obtained.

The present invention was made in view of the above-described circumstances. Accordingly, it is desirable to provide a semiconductor memory device capable of effectively reducing the consumption of current of the system of circuits associated with the refresh operation.

SUMMARY OF THE INVENTION

In order to solve the above-described issues, the present invention has the following constitution.

In accordance with the present invention, a semiconductor memory device configured to automatically refresh data stored in memory cells with timings matched over plural operation modes and to allow an external asynchronous access, wherein a leak breaking means is provided for breaking a leak path between a system of circuits associated with refresh operations and either a power source or a ground in an interval of time period of the refresh operations.

In accordance with this configuration, in the interval of time period between the refresh operations to be executed independently from the operating modes, the leak path of the system of circuits associated with the refresh operations is broken down, so that a consumption of current of this system of circuits is limited to a consumption of current generated in periods of time of actual fresh operations. The time of the refresh operation is sufficiently shorter than the interval of time period between the refresh operations and a refresh cycle time, for which reason the consumption of current of the system of circuits associated with the refresh operations is effectively reduced. In addition to this leak breaking means, another leak breaking means may be used for breaking down always a leakage of current of another system of circuits which remain in an inactive state in a stand-by mode, for the purpose of a further reduction to the consumption of current.

In accordance with the semiconductor memory device, the leak breaking means comprises, for example, a switch circuit inserted into the leak path and a control circuit for controlling the switch circuit to be in an OFF-state in the interval of time period.

In accordance with this configuration, the control circuit controls the switch circuit to be in the OFF-state in the interval of time period for breaking down the leak path, into which this switch circuit is inserted.

Accordingly, a reduction is made to the leakage of current of the system of circuits associated with the refresh operations in the interval of time period between the refresh operations.

In accordance with the semiconductor memory device, the switch circuit comprises, for example, an MOS transistor having a gate threshold voltage which is higher than transistors forming the system of circuits associated with the refresh operations.

In accordance with this configuration, the MOS transistor forming the switch circuit inserted into the leak path has the high gate threshold voltage for suppressing a sub-threshold current of this MOS transistor, for example. Accordingly, this MOS transistor is placed into the OFF-state in the interval of time period for effectively breaking down the above-described leak path.

In accordance with the semiconductor memory device, the system of circuits associated with the refresh operations receives a reduced power voltage.

In accordance with this configuration, reduction to the power voltage causes further reductions to the operating current and the leak current of the system of circuits associated with the refresh operations.

In accordance with the semiconductor memory device, the system of circuits associated with the refresh operations comprise MOS transistors having lower gate threshold voltages adopted to the reduced power voltage.

In accordance with this configuration, it is possible to reduce the power voltage without reducing the operating speed of the system of circuits associated with the refresh operations. Thus, a further reduction to the power consumption through the reduction of the power voltage is available without reducing the operating speed.

In accordance with the semiconductor memory device, the system of circuits associated with the refresh operations comprise a transistor, which forms a critical path and has a gate threshold voltage lower than a transistor forming a non-critical path.

In accordance with this configuration, a consumption of current by the circuit acting as the non-critical path can be reduced without reducing the operating speed of the circuit acting as the critical path. Accordingly, the consumption of current can be effectively reduced without dropping the operating speed apparently.

In accordance with the semiconductor memory device, the leak breaking means is configured to delay a chip select signal for generating an internal chip select signal so as to break down the leak path based on the internal chip select signal when the chip select signal for switch between a stand-by mode and an active mode is transitioned from an activated state into an inactivated state.

In accordance with this configuration, even if the chip select signal is toggled in a short time period, while the internal chip select signal is maintained in the active state. Accordingly, the system of circuits controlled by this internal chip select signal shows no unnecessary operations for avoiding unnecessary operating currents.

BRIEF DESCRIPTIONS OF DRAWINGS

FIG. 3 is a timing chart describing a basic refresh operation of the semiconductor memory device in accordance with the first embodiment of the present invention.

DETAILED DESCRIPTION OF VARIOUS EMBODIMENTS

The embodiments of the present invention will, hereinafter, be described.

First Embodiment

In accordance with this first embodiment, a semiconductor memory device comprises a pseudo-SRAM having a basic configuration of DRAM and being configured to allow an external asynchronous access, wherein the semiconductor memory device includes a refresh circuit system for automatically refreshing data stored in memory cells with timings matched over plural operation modes. The semiconductor memory device also includes a leak breaking means for breaking a leak path between the above refresh circuit system and either a power source or a ground in an interval of time period between the refresh operations for the purpose of reducing the consumption of current.

The following descriptions will be made for basic configuration and operation related to the refresh operations before describing characteristic configuration and operation of reducing the leakage of current of the system of circuits associated with the refresh operations.

(1) Basic Configuration and Operation in View of Refresh Operation

Figure 1:
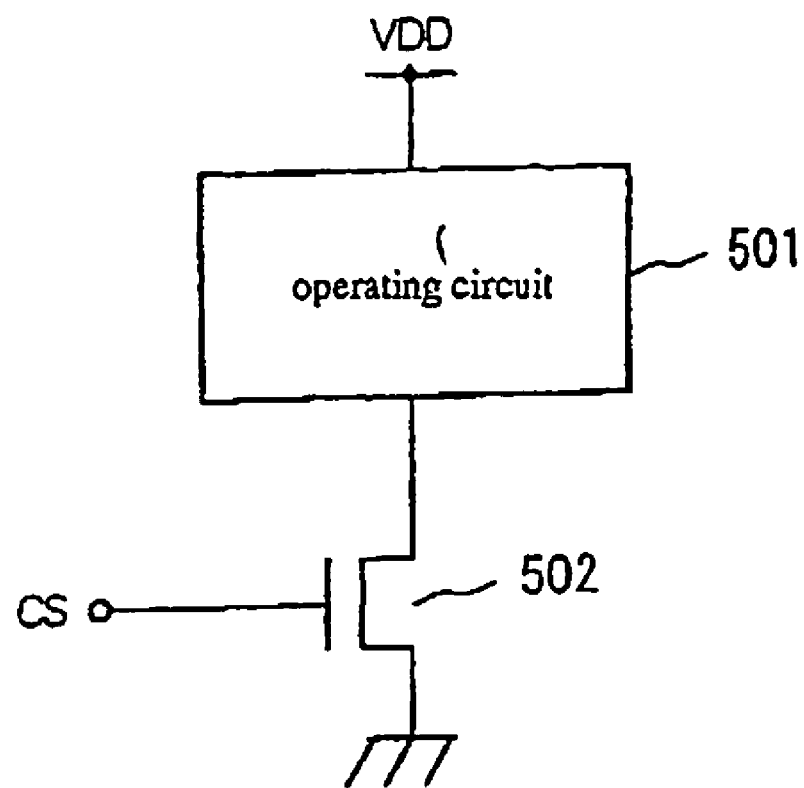
FIG. 1 is a view showing an example of a circuit configuration for reducing a leakage of current in accordance with the prior art.
Figure 2:
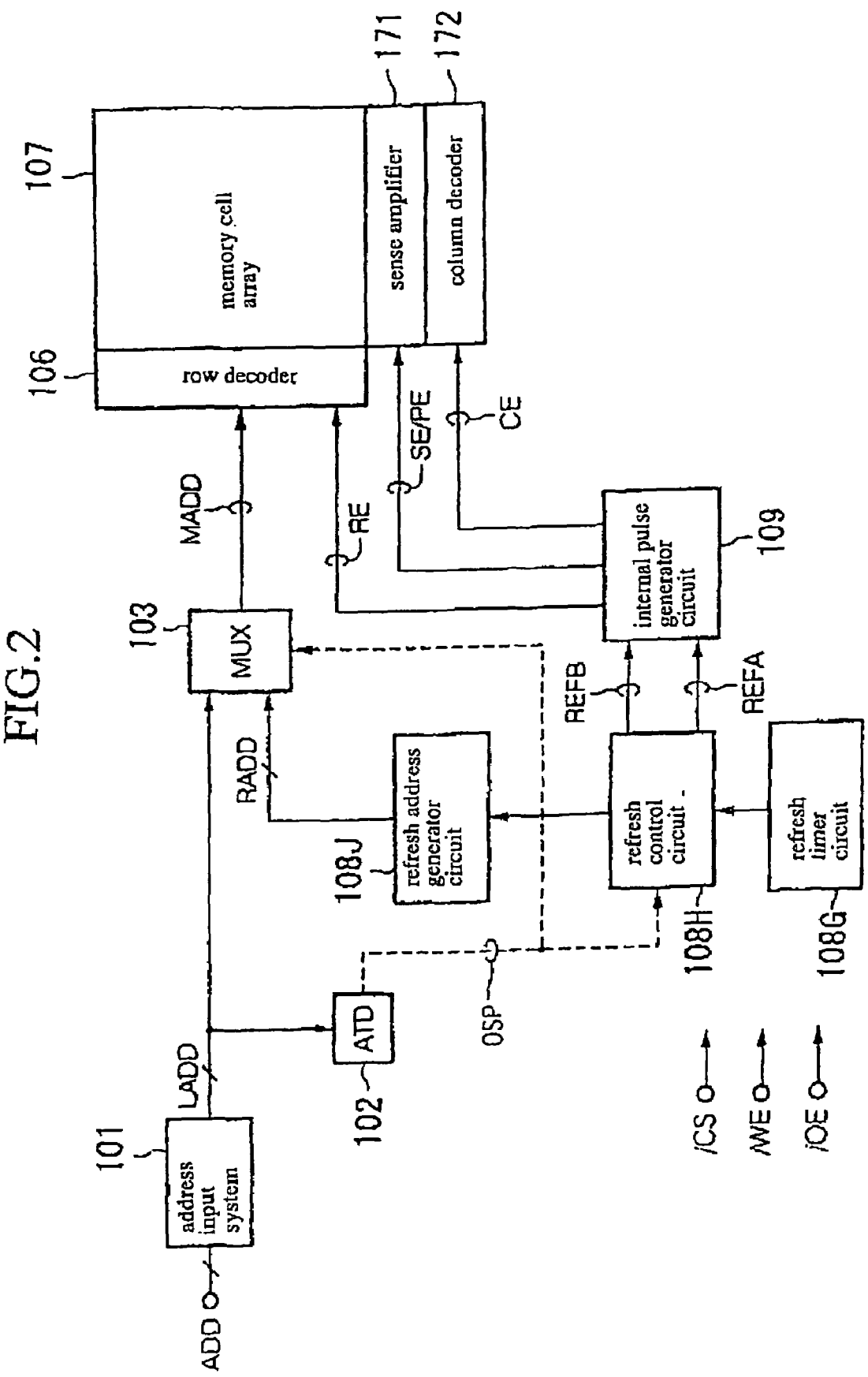
FIG. 2 is a block diagram schematically showing an entity of a basic configuration of a semiconductor memory device in accordance with a first embodiment of the present invention.

FIG. 2 schematically shows a whole configuration of a semiconductor memory device in accordance with this embodiment.

FIG. 2 shows the configuration concerning the basic refresh operations but not illustrates the configuration of reducing the consumption of current by the system of circuits associated with the refresh operations as a characteristic of this embodiment.

In this drawing, an address ADD is a signal externally given and includes a row address designating a row of a memory cell array to be described later and a column address of a column thereof. A chip select signal /CS ("/" representing negative logic) is a most significant control signal for this semiconductor memory device, and switches between a stand-by mode and an active mode. An output enable signal /OE is a control signal for enabling data to be outputted to the outside and for mainly controlling an active state of a data-out buffer on a final stage. A write enable signal /WE is a control signal for switching between a write mode and a read mode in an active mode.

An address input system 101 latches the address ADD and outputs an internal address LADD. An address transition detector circuit (ATD) 102 detects a transition of the internal address LADD and outputs a one-shot pulse signal OSP. An address multiplexer (MUX 103 outputs, as an address MADD, selected one of the row address included in the internal address LADD and a refresh address RADD to be described below.

A row decoder 106 decodes the address MADD for selecting a row of a memory cell array 107. The memory cell array 107 comprises a matrix array of memory cells similarly to the general-purpose DRAM. A sense amplifier 171 amplifies a data signal on a bit line for a read operation. A column decoder 172 selects a column of the memory cell array 107. Even illustration is not made, the column decoder 172 is supplied with a signal obtained through decoding a column address component of the internal address LADD outputted from the above-described address input system 101. A pre-charge circuit (not illustrated) for bit lines is provided accompanying to the sense amplifier 171.

A refresh timer circuit 8G times a refresh time interval. A refresh control circuit 8H controls a series of refresh operations and generates a refresh control signal REFA for controlling a timing of a refresh operation accompanying to an external access and a refresh control signal REFB for controlling a timing of a self-refresh operation.

A refresh address generator circuit 81 generates an address RADD (hereinafter referred to as "refresh address") to be used for the refresh operation. An internal pulse generator circuit 10 generates a row enable signal RE, a sense amplifier enable signal SE, a precharge enable signal PE and a column enable signal CE.

Other than the above-described circuits, there are further provided a system of circuits for controlling read and write operations, another system of circuits for generating a substrate potential of the memory cell array and still another system of circuits for read and write operations of data to the memory cell array.

The read and write operations and the refresh operation of the semiconductor memory device shown in FIG. 2 will, in sequence, be described as the basic operations with reference to a timing chart of FIG. 3.

A. Read And Write Operations

A read operation according to an address access will be described as one example. In this case, a chip select signal /CS and an output enable signal /OE are set at a low level, while a write enable signal /WE is set at a high level, wherein the address ADD is applied from the outside in accordance with the specification.

The address ADD is taken through the address input system 101 as the internal address LADD. Except for the refresh, this internal address LADD is supplied as the address MADD through the multiplexer 103 to the row decoder 106. At a timing defined by the row enable signal RE, the row decoder 106 selects one word line in the memory cell array 107, so that data of memory cells connected to this single row of this word line are read out onto respective bit lines. These data are amplified by the sense amplifier 171 at a timing defined by the sense amplifier enable signal SE.

On the other hand, based on a column address (not illustrated) included in the address ADD, and at a timing defined by the column enable signal CE, the column decoder 172 selects a bit line of the memory cell array 107, so that data on this bit line are supplied through the data output circuit system not illustrated to the outside. Prior to the operation of reading data from the memory cells, bit lines are pre-charged based on the pre-charge enable signal PE.

In the above-described series of read operations, upon a transition of the internal address LADD, the address transition detector circuit (ATD) 102 detects this transition of the internal address LADD and outputs a one-shot pulse signal OSP. By triggering this one-shot pulse signal OSP, the internal pulse generator circuit 109 outputs, at appropriate timings, the above-described row enable signal RE, the sense amplifier enable signal SE, the pre-charge enable signal PE and the column enable signal CE.

B. Refresh Operation (In Read Mode)

A refresh operation in a read mode will subsequently be described with reference to a timing chart shown in FIG. 3(a).

In the read mode, the semiconductor memory device shows a sequential performance of both the refresh operation and the read operation in the same cycle in accordance with the specification.

The address input system 101 latches an address A0 given from the outside as the address ADD and then outputs the internal address LADD. The address transition detector circuit 102 detects a transition of the internal address LADD and outputs the one-shot pulse signal OSP.

Upon receipt of the one-shot pulse signal OSP, the refresh control circuit 108H starts the refresh operation. Upon the start of the refresh operation, the refresh address generator circuit 108J generates and outputs a refresh row address R0 as the refresh address RADD. Under the control of the refresh control circuit 108H, the address multiplexer 103 supplies the refresh address RADD (the refresh row address R0) as the address MADD to the row decoder 106.

On the other hand, the internal pulse generator circuit 109 receives an input of the refresh control signal REFB from the refresh control circuit 108H, and outputs the row enable signal RE and the sense amplifier enable signal SE. The row decoder 106 receives inputs of the address MADD and the row enable signal RE and selects a word line designated by the refresh address R0 for a predetermined time period defined by the row enable signal RE. Data signals of the memory cells connected to the selected word line are amplified by the sense amplifiers 171 and then re-stored therein, whereby the data of the memory cells for the single row designated by the refresh address R0 have been refreshed.

After the refresh operation has been finished for the row designated by the refresh row address R0, then the read operation is made in the same cycle. For example, the address multiplexer 103 receives the internal address LADD from the address input system 101 and supplies the internal address LADD as the address MADD to the row decoder 106. The row decoder 106 selects the word line designated by the row address XO entered as the input address MADD. The sense amplifier 171 amplifies the data signal appearing on the bit line in the memory cell array 107 for reading out the data stored in the memory cell.

C. Refresh Operation (In Stand-by Mode)

A refresh operation in a stand-by mode will be described with reference to a timing chart shown in FIG. 3(b).

In the stand-by mode, the refresh control circuit 108H times a past time from a time of the last external request for access, so that if the past time becomes beyond a predetermined refresh time, then the refresh control circuit 108H outputs the refresh control signal REFB to start the self-refresh operation.

In the stand-by mode, for example, the refresh timer circuit 108G times a time interval for self-refresh operations. The refresh control circuit 108H controls the refresh address generator circuit 108J to generate the refresh row address R0 as the refresh address RADD at a timing obtained by the timing operation of the refresh timer circuit 108G. The address multiplexer 103 receives an input of the refresh row address R0 as the refresh address RADD and supplies it as the address MADD to the row decoder 106.

On the other hand, the refresh control circuit 108H outputs the refresh control signal REFB to cause the internal pulse generator circuit 109 to generate the row enable signal RE at the appropriate timing. The row decoder 106 receives the input of the refresh row address R0 as the address MADD from the address multiplexer 103 and also selects a word line designated by the refresh row address R0 for a predetermined time period at a timing defined by the row enable signal RE. Data stored in the memory cells connected to the selected word line are amplified by the sense amplifier 171 similarly to the above-described read mode and then re-stored in the original memory cells. Thereafter, in the stand-by mode, the refresh operations will be executed for the rows defined by the refresh addresses sequentially generated by the refresh address generator circuit 108J in accordance with timings generated by the refresh timer circuit 108G.

As described above, a voluntarily refresh (self-refresh) is executed with timings matched over the read mode and the stand-by mode. In accordance with the above-described example, the descriptions have been made for the read mode. In the write mode, the refresh is voluntarily executed with timings matched over the write mode and the stand-by mode. The refresh timings are matched over the read mode and the write mode. Namely, the refresh is executed independently from the operation modes. Matching the timings of the refresh over the plural operation modes allows the asynchronous access to the semiconductor memory device without taking into account the refresh from the outside.

(2) Characteristic Configuration and Operation for Reducing the Consumption of Current The characteristic configuration and operation for reducing the consumption of current in accordance with this embodiment will be described.

As described above, the semiconductor memory device is configured to perform the self-refresh independently from the active mode and the stand-by mode, for which reason as long as the self-refresh operation is concerned, in any operation modes, the interval of time period between the refresh operations is present. In this interval of time period, the leakage of current is caused. On the specification, the operation mode with appearance of the considerable leakage of current of this type is the stand-by mode. Accordingly, in accordance with this first embodiment, effective suppression to the leakage of current in the interval of time period between the self-refresh operations in the stand-by mode will be described as an example.

Figure 4:
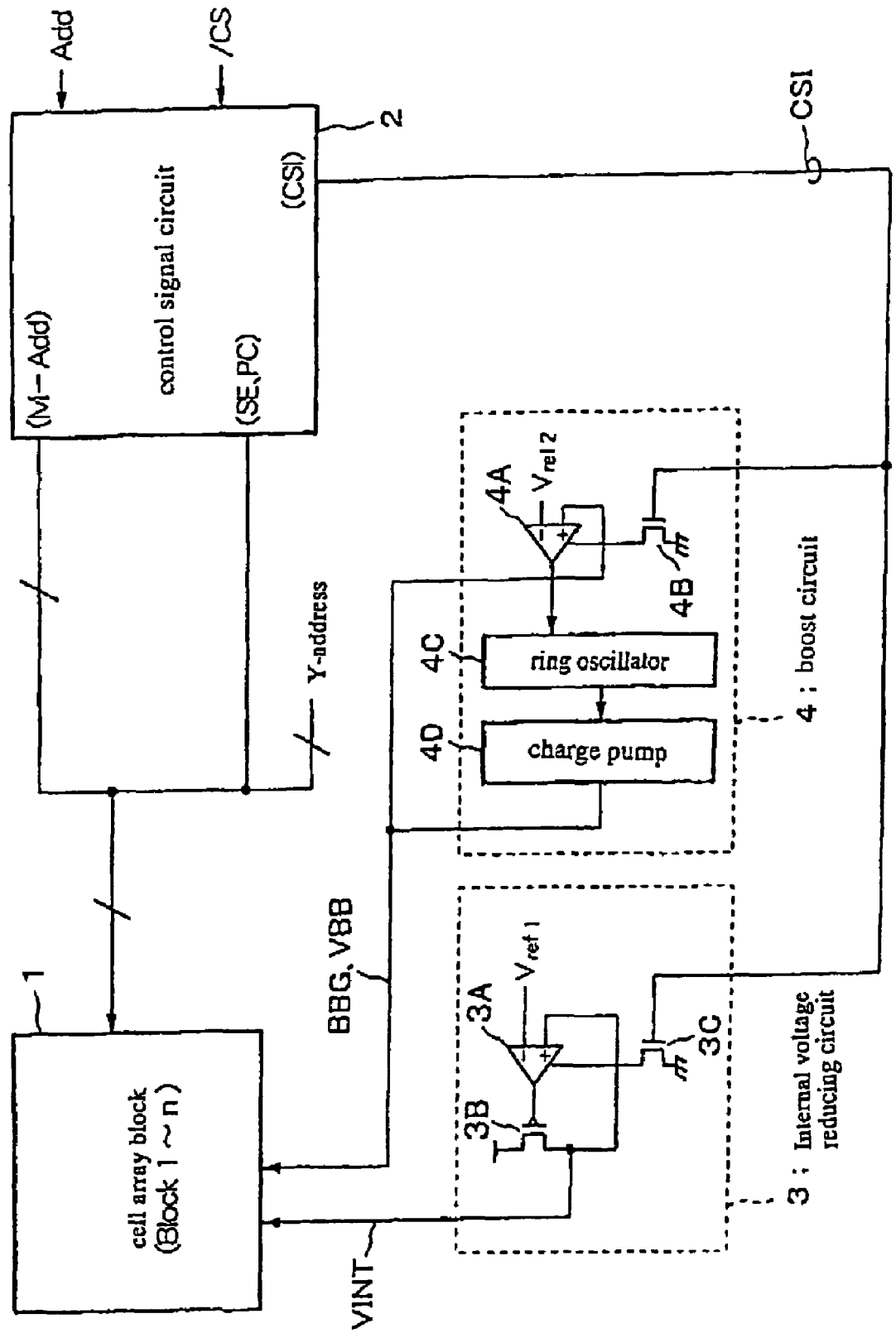
FIG. 4 is a block diagram schematically showing an entity of a characteristic configuration of the semiconductor memory device in accordance with the first embodiment of the present invention.

FIG. 4 schematically shows the configuration of the semiconductor memory device in accordance with this embodiment by attracting the function of reducing the consumption of current by the system of circuits associated with the refresh operations. In this drawing, the code 1 represents a cell array block comprising a matrix array of memory cells, wherein the cell array block 1 corresponds to the memory cell array 107 shown in FIG. 2. This cell array block 1 comprises the number "n" of divided blocks 1–n (n: the natural number not less than 2). In this example, the cell array block is divided into plural blocks, but this is optional.

The code 2 represents a control signal circuit which receives inputs of an address Add (corresponding to the address ADD shown in FIG. 2) and a chip select signal /CS. The control signal circuit 2 generates an internal address signal M-Add, a sense amplifier enable signal SE, a pre-charge signal PC, and an internal chip select signal CSI to be described later. This control signal circuit 2 is configured to have a function of generating the internal chip select signal CSI, in addition to the same functions of the address input system 101, the address transition detector circuit 102, the multiplexer 103, the refresh timer circuit 108G, the refresh control circuit 108K, the refresh address generator circuit 108J and the internal pulse generator circuit 109. Detailed configurations of this control signal circuit 2 will be described later.

The internal address signal M-Add includes the above-described address MADD and the above-described refresh address RADD shown in FIG. 2 as well as a block selecting signal. The pre-charge signal PC corresponds to the pre-charge enable signal PE shown in this drawing. The pre-charge signal PC is a control signal for pre-charging bit lines and data lines in the cell array block. The internal chip select signal CSI becomes low level in the interval of time period between refresh operations in the stand-by mode. The internal chip select signal CSI is a control signal for breaking down the leak path in the interval of time period. As described below, the internal chip select signal CSI is generated from the chip select signal /CS externally supplied. The internal chip select signal CSI has an inverted logic value to the chip select signal /CS, provided that internal chip select signal CSI is forcibly transitioned into the high level during the refresh operation.

The internal address signal M-Add, the sense amplifier enable signal SE, and the pre-charge signal PC are supplied to the cell array block 1 together with an Y-address (column address) included in the internal address LADD. A part of this Y-address is used for selecting a column of the cell array block 1. The remaining parts of the Y-address are used for selecting the blocks 1~n. In this example, the Y-address is generated by the different system of circuits from the control signal circuit 2. It is also possible that the Y-address is generated by the control signal circuit 2.

The code 3 represents an interval voltage-own circuit for generating a reduced internal voltage VINT. A reference voltage Vref1 lower in voltage than an external power voltage is compared to the internal voltage VINT by a comparator 3A, so that a current to be supplied through a p-channel transistor 3B is controlled in accordance with a difference between them, thereby reducing the external power voltage for generating the internal voltage VINT. An n-channel transistor 3C supplies the ground voltage to the comparator 3A. The n-channel transistor 3C acts as a switch circuit for breaking down the leak path between the comparator 3A and the ground.

The code 4 represents a boost circuit for generating a boost voltage VBB providing a potential to the word line and a substrate voltage BBG in the-cell array block 1. The boost circuit 4 comprises a comparator 4A, an n-channel transistor 4B, a ring oscillator 4C and a charge pump 4D. The n-channel transistor 4B supplies the ground level to the comparator 4A. The n-channel transistor 4B acts as a switch circuit for breaking down the leak path between the comparator 4A and the ground. In accordance with this boost circuit 4, the comparator 4A compares the substrate voltage BBG to a reference voltage Vref2 for causing the substrate voltage BBG to be equal to this reference voltage. The ring oscillator 4C oscillates at a predetermined frequency based on a power of the output from the comparator 4A. The boost voltage VBB boosted from the oscillated output is then outputted from the charge pump 4D. The comparators provided in the above-described internal voltage-down circuit 3 and the boost circuit 4 do not function and are placed in the inactive state in the stand-by mode. In the stand-by mode, however, the p-channel transistor 3B, the charge pump 4D and the ring oscillator 4C are controlled in the active state for continuing the supplies of the boost voltage VBB and the substrate voltage BBG.

Figure 5:
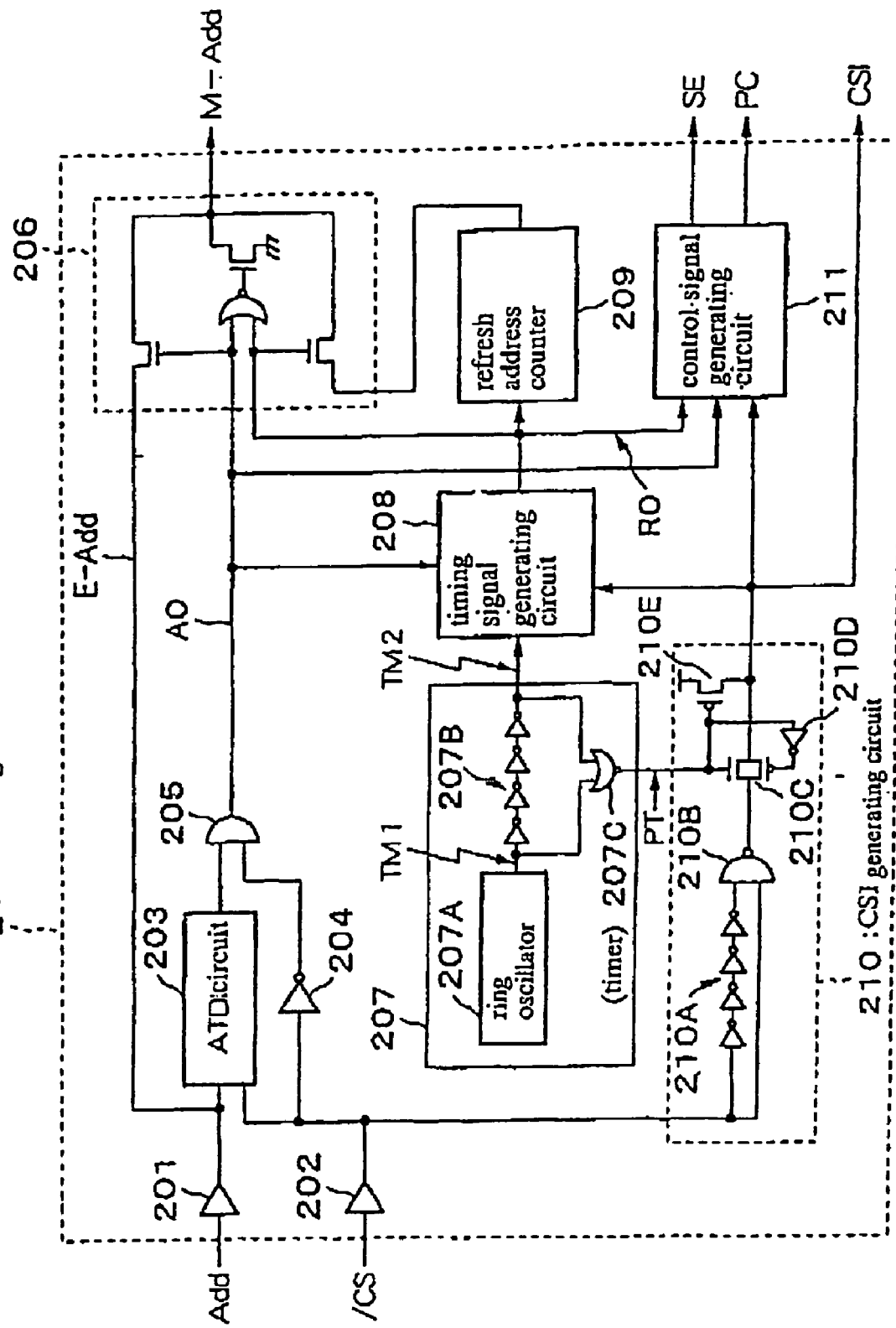
FIG. 5 is a block diagram showing a configuration of a control signal circuit in accordance with the first embodiment of the present invention.

FIG. 5 shows the detailed configuration of the control signal circuit 2.

In this drawing, the code 201 represents an input buffer which receives an input of the address Add. The input buffer 201 corresponds to the address input system 101 shown in FIG. 2. The code 202 represents an input buffer which receives an input of the chip select signal /CS. The code 203 represents an address transition detector circuit which corresponds to the address transition detector circuit 102. The code 204 represents an inverter, while the code 205 represents a NAND-gate. The inverter 204 and the NAND-gate 205 form a gate circuit for inactivating the output signal (one shot pulse) from the address transition detector circuit 203 in the stand-by state. The NAND-gate 205 performs a NAND-operation of the output signal (one shot pulse) from the address transition detector circuit 203 and the chip select signal /CS so as to output a one-shot pulse signal AO.

The code 206 represents a multiplexer which corresponds to the address multiplexer 103 shown in FIG. 2. The code 207 represents a timer circuit. The code 208 represents a timing signal generator circuit. The timer circuit 207 and the timing signal generator circuit 208 correspond to the refresh timer circuit 108G shown in FIG. 2. The timing signal generator circuit 208 outputs the one-shot pulse signal R0 at a cycle defined by a timer signal TM. The code 209 represents a refresh address counter which corresponds to the refresh address generator circuit 108J shown in FIG. 2.

The code 210 represents a CSI generator circuit which generates the above-described internal chip select signal CSI. The code 211 represents a control signal generator circuit which corresponds to the refresh control circuit 108H and the internal pulse generator circuit 109 shown in FIG. 2. This control signal generator circuit 211 generates and outputs the sense amplifier enable signal SE and the precharge signal PC from the one-shot pulse signals A0, R0 and the internal chip select signal CSI.

The above-described timer circuit 207 comprises a ring oscillator 207A, an inverter chain 207B, and a NOR-gate 207C. The ring oscillator 207A generates a timer signal TM1 having a predetermined clock cycle. The inverter chain 207B delays the timer signal TM1 and generates the timer signal TM2. The NOR-gate 207C performs the NOR-operation of the timer signals TM1 and TM2 to generate a signal PT.

The above-described CSI generator circuit 210 comprises an inverter chain 210A, a NAND-gate 210B, a transfer gate 210C, an inverter 210D and a p-channel transistor 210E. The inverter chain 210A and the NAND-gate 210B function as a delay circuit for delaying the high level of the chip select signal /CS. The transfer gate 210C, the inverter 210D and the p-channel transistor 210E function as a gate for forcibly causing the internal chip select signal CSI to be transitioned into the high level, based ion the signal PT outputted from the timer circuit 207.

Figure 6:
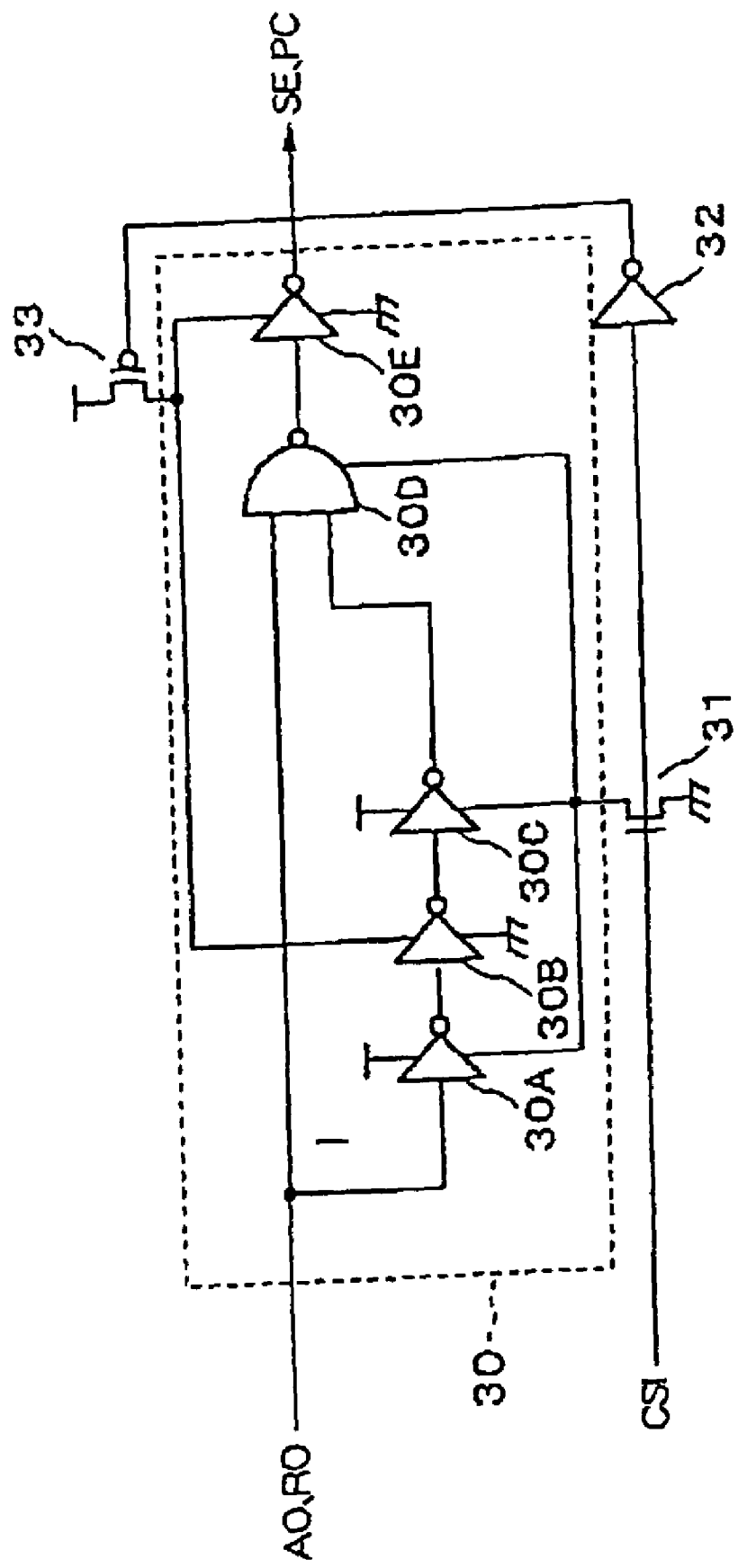
FIG. 6 is a block diagram showing a configuration of a control signal generating circuit in accordance with the first embodiment of the present invention.

FIG. 6 shows an example of the configuration of the above-described control signal generator circuit 211.

Even the one-shot pulse signals A0, R0 as the input signals are illustrated in combination in FIG. 6, the control signal generator circuit shown in FIG. 6 is provided for each of those one-shot pulse signals A0, R0, to generate the sense amplifier enable signal SE and the precharge signal PC. The code 30 represents a signal generator circuit for generating the sense amplifier enable signal SE and the pre-charge signal PC from the one-shot pulse signals A0, R0. The code 31 represents an n-channel transistor inserted into between the ground and the signal generator circuit 30. The code 32 represents an inverter. The code 33 represents a p-channel transistor inserted into between the power supply and the signal generator circuit 30.

A gate of the n-channel transistor 31 is supplied with the internal chip select signal CSI. A gate of the p-channel transistor 33 is supplied with an inversion signal inverted by the inverter 32 from the internal chip select signal CSI. The n-channel transistor 31 and the p-channel transistor 33 show concurrent switching operations of ON and OFF. Gate threshold voltages of the n-channel transistor 31 and the p-channel transistor 33 are set higher than the gate threshold voltage of the MOS transistors forming the signal generator circuit 30 so as to effectively suppress the sub-threshold current.

The signal generator circuit 30 comprises inverters 30A, 30B, 30C, an NAND-gate 30D and an inverter 30E, all of which have CMOS configuration. One input of the NAND-gate 30D is supplied with the one-shot pulse signals A0, R0. Another input of the NAND-gate 30D is supplied with the above-described one-shot pulse signals AO, RO which have been transferred through the inverter chain (delay path) comprising the inverters 30A and 30C. An output from the NAND-gate 30D is supplied to the inverter 30E. An output from the inverter 30E is the sense amplifier enable signal SE and the pre-charge signal PC. The inverters 30A and 30C and the NAND-gate 30D are supplied with the ground through the n-channel transistor 31, while the inverters 30B and 30E are supplied with the power through the p-channel transistor 33.

The characteristic configuration in accordance with this first embodiment has been described.

The characteristic operations in this first embodiment, namely the operation (leak breaking down operation) of breaking down the leakage of current generated in the interval of time period between the self-refresh operations in the stand-by mode will, hereinafter, be described.

This operations are made based on the above-described internal chip select signal CSI. Process for generating the internal chip select signal CSI and the technical sense of this signal will be described before descriptions of the leak breaking down operation.

The process for generating the internal chip select signal CSI based on the chip select signal /CS will be described with reference to FIG. 7.

Figure 7:
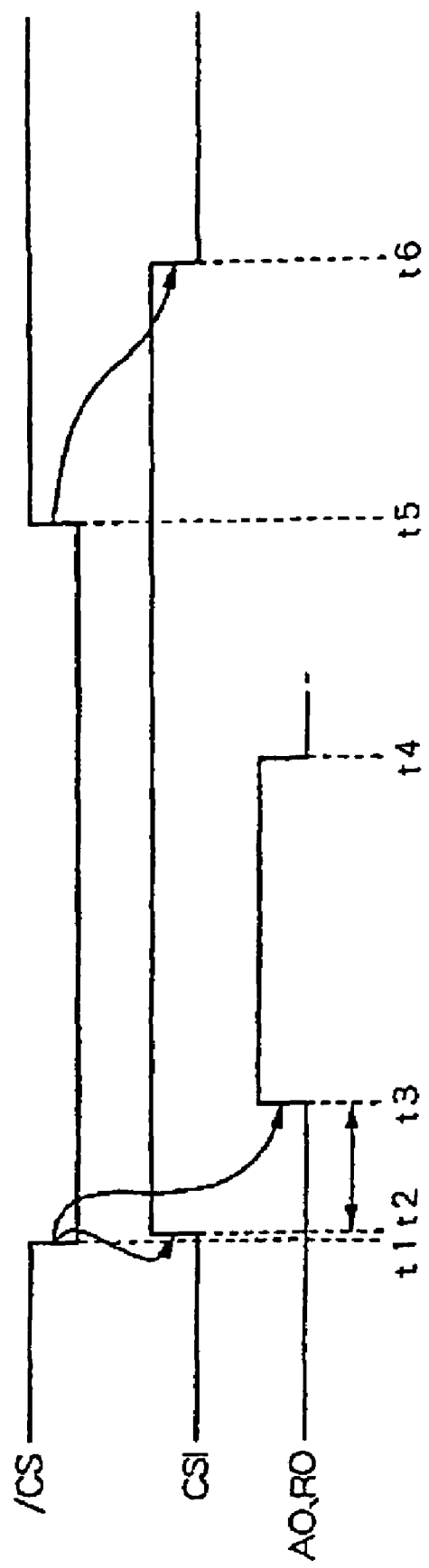
FIG. 7 is a timing chart describing processes for generating an internal chip select signal CSI from a chip select signal /CS in accordance with the first embodiment of the present invention.

As shown in FIG. 7, at a time t1, the chip select signal /CS is transitioned into the low level (in other words, the chip select signal CS is transitioned to the high level), whereby the operation mode of the semiconductor memory device becomes the active mode. In the CSI generator circuit 210 shown in FIG. 5, the inversion signal from the chip select signal /CS is outputted as the internal chip select signal CSI with by-passing the inverter chain 210A at a time t2 which is immediately after the time t1.

Upon this chip select signal /CS, in a period of time defined from a time 3 to a time t4, the one-shot pulse signals AO, RO of the high level are outputted from the NAND-gate 205 and the timing signal generator circuit 208, respectively.

Upon the one-shot pulse signals AO, RO, the signal generator circuit 30 shown in FIG. 6 is operated to output the sense amplifier enable signal SE and the pre-charge signal PC. For example, the signal generator circuit 30 outputs the high level pulse signals of the sense amplifier enable signal SE and the pre-charge signal PC because both inputs into the NAND-gate 30D are in the high level during a period of time, wherein both the input and output signals of the delay circuit comprising the inverters 30A~30C are in the high level, provided that the period of time is namely defined from the time t3 of transitions of the one-shot pulse signals AO, RO from the low level to the high level and until a time has been past which corresponds to the delay time of the inverter chain.

At a time t5, he chip select signal /CS is transitioned to the high level (in order words, the chip select signal CS is transitioned into the low level), whereby the operation mode becomes the stand-by mode. In the CSI generator circuit 210 shown in FIG. 5, the inversion signal from the chip select signal /CS is delayed by the inverter chain 210A, whereby the sense amplifier enable signal SE and the pre-charge signal PC are outputted with a delay. As a result, in FIG. 7, the internal chip select signal CSI is transitioned gain to the low level at a time t6 which is later than the time t5 by the delay time of the above-described inverter chain 210A.

As described above, the internal chip select signal CSI is promptly transitioned into the high level for transition into the active mode. At the same time when the operation mode becomes the active mode, a system of circuits receiving the input of the internal chip select signal (for example, the internal voltage down circuit 3 and the boost circuit 4) is controlled in the operable state. In contrast, if the operation mode becomes the stand-by mode (namely the chip select signal /CS is transitioned from the active state to the inactive state), the chip select signal /CS is delayed to generate the internal chip select signal CSI. The internal chip select signal CSI is transitioned into the low level with a delay of a predetermined time, thereby breaking down the leak path. The reason why the internal chip select signal CSI is delayed for transition of the operation mode from the active mode into the stand-by mode would be to maintain the internal chip select signal CSI in the high level (in the active state) when the chip select signal /CS is toggled at a short cycle, for the purpose of suppressing any unnecessary operation current of the circuit system which receives the input of the internal chip select signal CSI.

Figure 8:
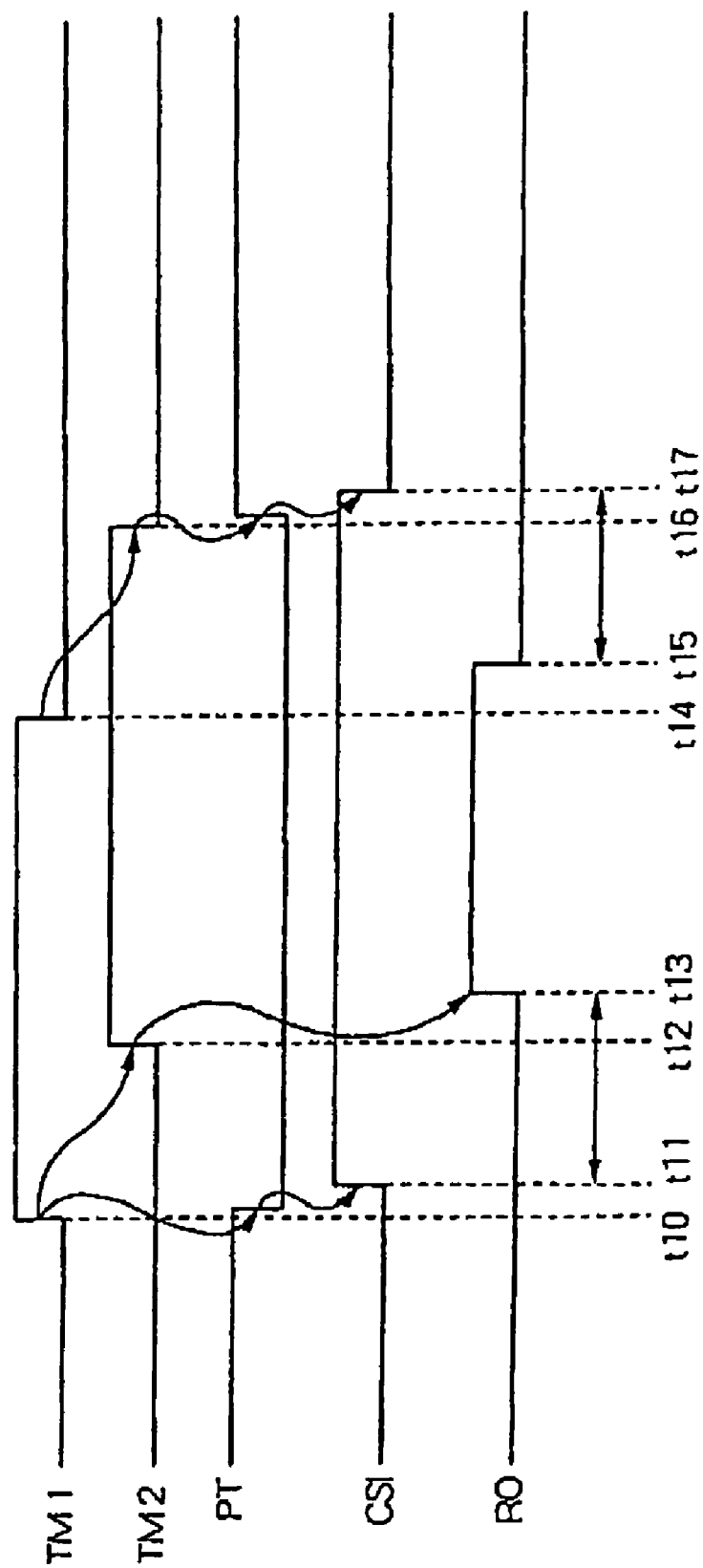
FIG. 8 is a timing chart describing processes for generating an internal chip select signal CSI from timer signals TM1, TM2 in accordance with the first embodiment of the present invention.

The process for generating the internal chip select signal CSI based on the timer signals TM1 and TM2 in the stand-by mode will be described with reference to FIG. 8.

In the initial state, the chip select signal /CS is in the high level, and the operation mode is the stand-by mode. Prior to a time t10, upon receipt of the high level of the chip select signal /CS, the NAND-gate 210B outputs the low level of the internal chip select signal CSI. As described later, the internal chip select signal CSI is in the low level in the interval of time period between the refresh operations, and functions of breaking the leak path of the system of circuits associated with the refresh operations.

At the time t10, the ring oscillator 207A outputs the timer signal TM1 which is transitioned to the high level, upon which the refresh operation is started, and the NOR-gate 207A outputs the low level of the signal PT. Upon receipt of this signal PT, the p-channel transistor 210E turns ON, while the transfer gate 210C turns OFF, whereby at a time t11, the internal chip select signal CSI is transitioned to the high level.

On the other hand, the timer signal TM1 is delayed by the inverter chain 207B and then outputted as the timer signal TM2 from the timer circuit 207 at a time t12. Upon receipt of this timer signal TM2, the timing signal generator circuit 208 outputs the high level of the one-shot pulse signal RO at a time t13. This one-shot pulse signal RO is inputted into the multiplexer 206, the refresh address counter 209 and the control signal generator circuit 211 thereby executing a series of the refresh operations.

The one-shot pulse signal RO is delayed by the inverter chain 207B and then transitioned to the high level after the transition of the internal chip select signal CSI. Namely, the internal chip select signal CSI is transitioned into the high level by the timer signal TM1 before the transition of the one-shot pulse signal RO, thereby breaking down the leak path of the system of circuits associated with the refresh operations such as the power system and the control system, prior to the refresh operation is executed. Even if those circuits are in the inoperable state (in non-responsible state to the input signal), then it is possible to activate previously operations of the power system and the control system before the internal operations for refresh (selecting word and activating sense amplifier) are started. Accordingly, it is possible to perform the refresh operation without any trouble even if the leak path of the system of circuits associated with the refresh operation remains broken down.

At a time t14, the timer signal TM1 is transitioned to the low level, whereby at a time t16, the timer signal TM2 is transitioned to the low level, while the signal PT is transitioned to the high level. Upon receipt of this signal PT, the p-channel transistor 210E turns OFF, while the transfer gate 210C turns ON, resulting in that at a time t17, the internal chip select signal CSI is transitioned to the low level. The transition of the internal chip select signal CSI into the low level causes that the leak path of the system of circuits receiving the input of the internal chip select signal CSI is broken down. The one-shot pulse signal RO is transitioned to the low level at a time t15 which is later by a predetermined time period from the time t13, whereby the internal operations based on the one-shot pulse signal RO have been completed before a time t17 when the internal chip select signal CSI is transitioned to the low level.

As described above, the internal chip select signal CSI provides for a time period, in which the system of circuits associated with the refresh operation is in the operable state. Namely, the internal chip select signal CSI provides for another time period, for example, the interval of time period between the refresh operations, in which the system of circuits associated with the refresh operation is in the inoperable state. In this point of view, in accordance with the first embodiment, the internal chip select signal CSI services as a control signal for breaking down the leak path of the system of circuits associated with the refresh operation by triggering the timer, in the interval of time period between the refresh operations.

The process for generating the internal chip select signal CSI and the significance of this signal have been described above.

Descriptions will be made with reference to FIGS. 4 and 6 for the leak breaking down operation based on the internal chip select signal CSI.

In the configuration shown in FIG. 4, the comparators 3A and 4A are fixed in a static operation state in the stand-by mode. Namely, in the stand-by mode, the comparators 3A and 4A are in the operation state but in the static operation state, wherein the internal signals are not dynamically transitions. The comparators 3A and 4A are configured so that the supply of the ground potential is not needed for maintaining this static operation mode. In this case, in the inside of the comparators 3A and 4A, tie leak path provides a connection between the power supply and the ground, whereon the n-channel transistors 3C and 4B are inserted onto the leak path.

In this state, the internal chip select signal CSI is transitioned to the low level in the refresh interval of time period. The n-channel transistors 3C and 4B with the gates which receive the internal chip select signal CSI will turn OFF, whereby the leak paths between the comparators 3A and 4A and the ground are broken down to prevent the leak current of the comparators 3A and 4A. Since the gate threshold voltage of the n-channel transistor 3C is set higher than the gate threshold voltage of the MOS transistors forming the comparators 3A and 4A, the sub-threshold current in the OFF-state is suppressed. Accordingly, the leakage of current between the comparators 3A and 4A and the ground is effectively suppressed.

The leak breaking down operation will be described with reference to FIG. 6.

In this drawing, the one-shot pulse signals AO, RO are in the low level. In this state, in the inside of the CMOS-configured inverters 30A, 30C and the NAND-gate 30D, the n-channel transistors are in the OFF-state. In the inside of the inverters 30B and 30E, the p-channel transistors are in the OFF-state. The gate threshold voltages of those MOS transistors being in the OFF-state are set low so that the sub-threshold currents of those transistors are relatively large so remarkable as the leakage of current.

The internal chip select signal CSI is transitioned to the low level, whereby the n-channel transistor 31 turns OFF, whereby the leak paths between the inverters 30A, 30C and the NAND-gate 30D and the ground are broken down. Since the gate threshold voltage of the n-channel MOS transistor 31 is set so high as suppressing the sub-threshold current, the leakage of current flowing through the n-channel transistors of the above-described inverters 30A, 30C and the NAND-gate 30D is suppressed by the n-channel transistor 31. Similarly, the internal chip select signal CSI is transitioned to the low level, whereby the p-channel transistor 33 having the high gate threshold voltage turns OFF, thereby to effectively suppress the leakage of current between the inverters 30B and 30E and the power supply.

The leak break down operations have been described.

As described above, in accordance with the semiconductor memory device of this first embodiment, the leak path of the system of circuits associated with the refresh operations is broken down in the interval of time period between the refresh operations which are discontinuously executed. At this time, the state of the internal signals of the system of circuits associated with the refresh operations is identical with the state that the leak path is not brown down. In this point of view, the circuit state is kept in the same state as supplying the power. Accordingly, in accordance with this embodiment, the current suppression is caused without discontinuation of the power supply.

In addition, in this first embodiment, the leak path is broken down with supplying the power (power or ground) necessary for maintaining the signal state in the inside of the circuit, whereby the leakage of current can effectively be suppressed in the interval of time period, with keeping the original signal state in the interval of time period. Accordingly, the technical concept of breaking the leakage of current in accordance with this embodiment is different from the conventional measure of breaking the power supply to reduce the consumption of current.

As described above, in accordance with the first embodiment, the leak path of the system of circuits associated with the refresh operations is broken down in the interval of time period between the refresh operations for effectively reducing the consumption of current in the stand-by mode.

The two different timer signals TM1 and TM2, on of which is delayed from another, are used to generate the internal chip select signal CSI, based on which the leak path is broken down in the interval of time period, so that the leak path once broken will promptly be recovered before the refresh operations. Accordingly, at the transition from the interval of time period to the refresh operation, the system of circuits with the broken leak path can be recovered to the operable state for prompt execution of the refresh operation.

In this first embodiment, the leak path is broken down which was formed in the interval of time period in the stand-by mode. This is optional. The technical concept of the present invention is applicable to any types of the refresh, for example, the self-refresh to be executed by triggering the timer generated if no address transition is caused in a predetermined period of time in the active mode.

Second Embodiment

The second embodiment of the present invention will be described hereinafter.

Figure 9:
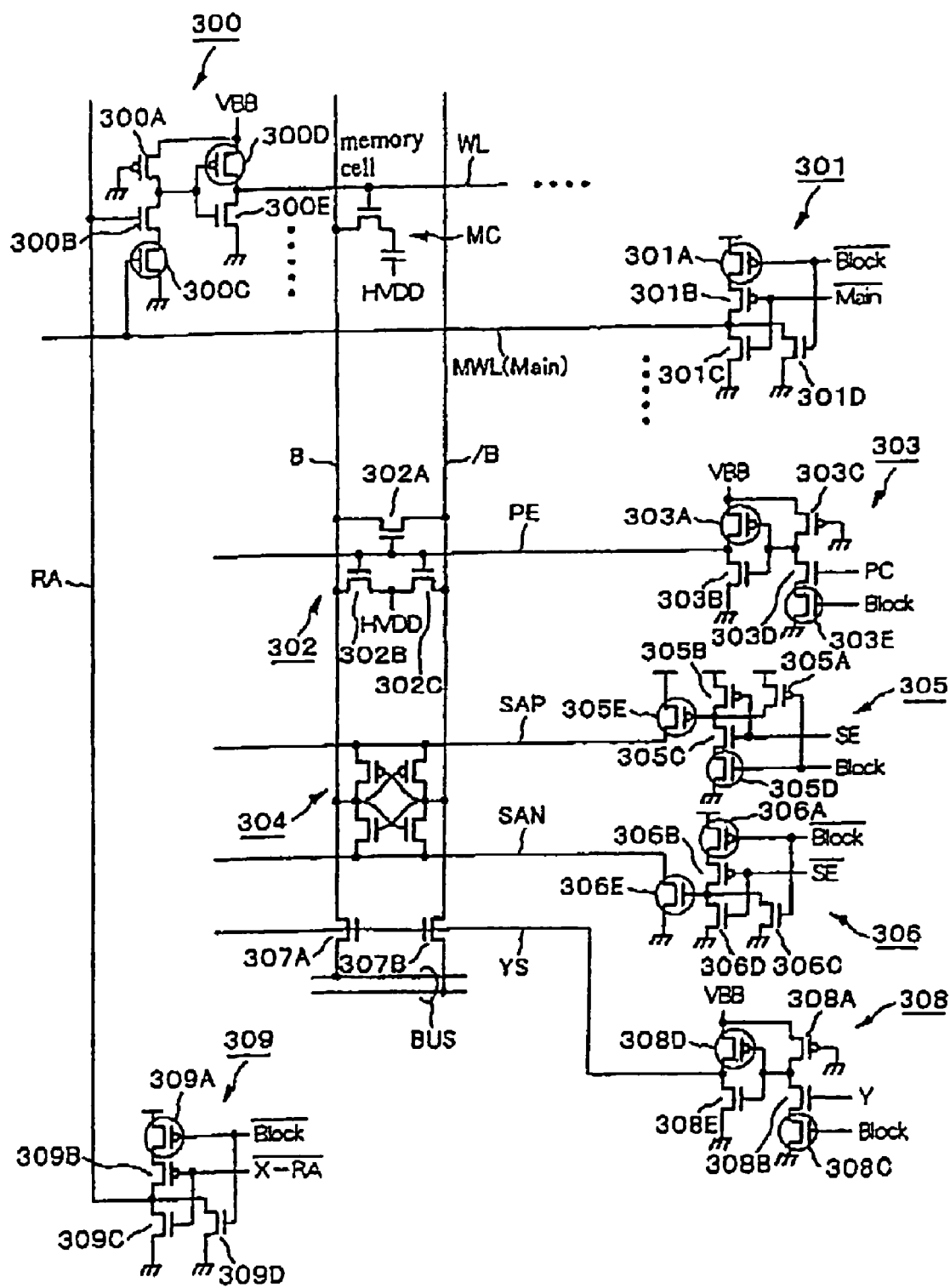
FIG. 9 is a block diagram schematically showing a configuration (cell array block) of a semiconductor memory device in accordance with a second embodiment of the present invention.

In accordance with this second embodiment, in addition to the above-described configuration of the first embodiment, a gate threshold voltage of transistors forming a critical path is set lower than a gate threshold voltage of transistors forming a non-critical path. FIG. 9 shows an example of the characteristic configuration of the semiconductor memory device in accordance with the second embodiment.

This example shown in the drawing includes memory cells and those peripheral circuits. In this drawing, a MOS transistor encompassed by a circle mark is a transistor having a high gate threshold voltage. The code MC represents memory cells aligned in matrix and being connected bit lines B, /B running in a column direction, and word lines WL running in a row direction. Each of the memory cells MC comprises a single transistor and a single capacitor, wherein one electrode of the capacitor is fixed at a voltage HVDD.

The code 300 represents a word line driver which comprises n-channel transistors 300A, 300D and n-channel transistors 300B, 300C and 300E. The word line driver 300 is selected by a row address RA and a main word line MWL for driving a word line WL. This diver 300 has a function of an AND-gate. The code 301 represents a main word line driver which comprises p-channel transistors 301A, 301B and n-channel transistors 301C, 301D. The main word line driver 301 is selected by a block selecting signal /Block and a main word line selecting signal /Main for driving a main word line MWL. This driver 301 has a function of an NOR-gate.

The code 302 represents a bit line pre-charge circuit, which comprises n-channel transistors 302A~302C. The n-channel transistor 301A is provided for unifying potentials of the bit lines B, /B. The n-channel transistors 302B, 302C is provided for charging up the bit line at the voltage HVDD. The code 303 represents a driver for outputting a pre-charge enable signal PE. The driver 303 comprises p-channel transistors 303A and 303C and n-channel transistors 303B, 303D and 303E. This driver 303 has a function of an AND-gate. The code 304 represents a latch-type sense amplifier which comprises a flip-flop, which comprises a cross-connected paired CMOS inverters supplied with sense amplifier control signals SAP and NAP as power and ground.

The code 305 represents a driver for outputting the sense amplifier control signal SAP. The driver 305 comprises p-channel transistors 305A, 305B, 305E and n-channel transistors 305C and 305D. This driver 305 has a function of an AND-gate which outputs the high level in the active state. The code 306 represents a driver for outputting the sense amplifier control signal NAP. The driver 306 comprises p-channel transistors 306A and 306C, and n-channel transistors 306C, 306D and 306E. This driver 306 has a function of an OR-gate outputting the low level in the active state.

A transfer gate 307 comprises n-channel transistors 307A and 307B which connects a single pair of bit lines B, /B to another single pair of data lines BUS. The transfer gate 307 serves as a switch selecting the bit lines. The code 309 represents a driver for outputting a row address RAY The driver 309 comprises p-channel transistors 309A, 309B and n-channel transistors 309C and 309D. This driver 309 has a function of a NOR-gate.

The operations of the circuits shown in FIG. 9 will be described by attracting a critical path with reference to FIG. 10.

The operations of reading out data from the memory cells MC shown in FIG. 9 may comprise the following operations:
 (a) operation of pre-charging bit lines B, /B;
 (b) operation of selecting a memory cell MC;
 (c) operation of activating a sense amplifier to amplify data signal on the bit lines; and
 (d) operation of rendering conductive MOS transistors 307A and 307B forming a column switch.

Those operations should be executed time-sequentially for satisfying the predetermined timings, for which reason each of those operations has a critical path.

Figure 10:
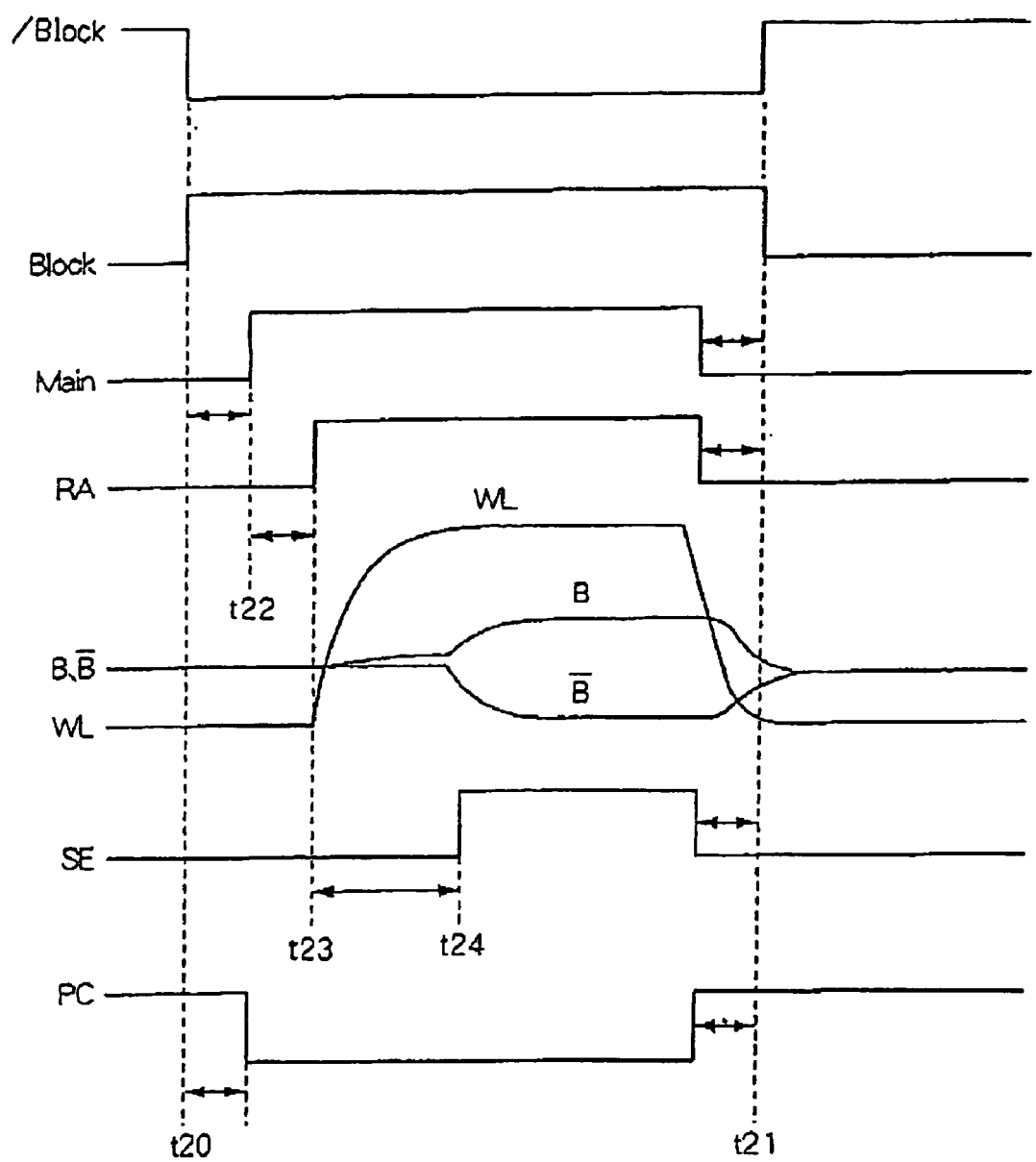
FIG. 10 is a timing chart describing a read operation of the semiconductor memory device in accordance with the second embodiment of the present invention.

In FIG. 10, at a time t20, the block selecting signal /Block inputted to the driver 301 is transitioned to the low level. At a time t22, the main word line selecting signal Main is transitioned to the high level (/Main of FIG. 9 is transitioned to the low level), whereby the main word line MWL is driven to the high level. At a time t20, the block selecting signal /Block inputted to the driver 309 is transitioned to the low level and the row address signal /X-RA is transitioned to the low level, whereby at a time t23, the row address RA is driven to the high level. Upon the main word line MWL and he row address RA being driven to the high level, the driver 300 drives the word line WL to the high level, whereby the memory cell MC is selected for causing stored data to be on the bit lines B, /B.

At a time t24, the sense amplifier enable signal SE is transitioned to the high level at a predetermined timing, whereby the driver 305 drives the sense amplifier control signal SAP to the high level. At the same time t24, the sense amplifier enable signal /SE shown in FIG. 9 is transitioned to the low level, whereby the driver 306 drives the sense amplifier control signal SAN into the low level. As a result, the sense amplifier 304 is activated to amplify the data on the bit lines B, /B. At a time t21, the block selecting signal Block is transitioned to the low level, while the block selecting signal /Block is transitioned to the high level, whereby the read operation from the memory cell is finished.

An investigation will, hereinafter, be made for the MOS transistor providing the critical path. The critical path comprises the MOS transistors supplied with the signal level which defines the timings of the internal operation, while the non-critical path comprises the MOS transistor supplied with the signal level having already been defined.

(a) Critical Path to Operation of Selecting Memory Cell

The drivers 300, 301 and 309 are associated with this operation. In FIG. 10, the block selecting signal Block has been defined before the main word selecting signal Main, for which reason the p-channel transistor 301A in the driver 301 forms no critical path, wherein the p-channel transistor 301A receives the block selecting signal /Block and drives the main word line MWL to the high level.

In the driver 309, the p-channel transistor 309A forms no critical path, wherein the p-channel transistor 309A receives the block selecting signal /Block and drives the row address RA to the high level. In the driver 300, the n-channel transistor 300C driven by the main word lime MWL and the p-channel transistor 300D with the gate driven by this n-channel transistor 300C form no critical path.

(b) Critical Path to Operation of Pre-charging Bit Line

The driver 303 is associated with this operation. In FIG. 10, the block selecting signal Block has been defined before the pre-charge signal PC, for which reason in the driver 303, the n-channel transistor 303E receiving the input of the block selecting signal Block and the p-channel transistor 303A with the gate driven by the p-channel transistor 303E form no critical path.

(c) Critical Path to Operation of Activating Sense Amplifier to Amplify Data

The drivers 305 and 306 are associated with this operation. In the driver 305, the n-channel transistor 305D receiving the input of the block selecting signal Block and the p-channel transistor 305E with the gate driven by the n-channel transistor 305D form no critical path. In the driver 306, the p-channel transistor 306A receiving the input of the block selecting signal /Block and the n-channel transistor 306E with the gate driven by the p-channel transistor 306A form no critical path.

(d) Critical Path to Operation of Rendering Conductive Column Switch

The driver 308 is associated with this operation. In the driver 308, the n-channel transistor 308C receiving the input of the block selecting signal Block and the p-channel transistor 308D with the gate driven by the n-channel transistor 308C form no critical path.

In accordance with this second embodiment, the MOS transistors forming the noncritical path have high gate threshold voltages, while the MOS transistors forming the critical path have low gate threshold voltages. This configuration allows an effective reduction to the leakage of current without reducing the operation speed. A large number of the driver leak paths are broken down to effectively reduce the leakage of current.

Third Embodiment

The third embodiment will be described hereinafter.

In his third embodiment, a power circuit in the cell array block 1 shown in FIG. 4 in the above-described first embodiment is controlled by the internal chip select signal CSI in order to reduce the leakage of current of the cell array block 1.

The cell array block 1 has a large number of drivers for selecting memory cells for executing the refresh operations, for which reason the cell array block 1 is involved into the system of circuits associated with the refresh operations.

Figure 11:
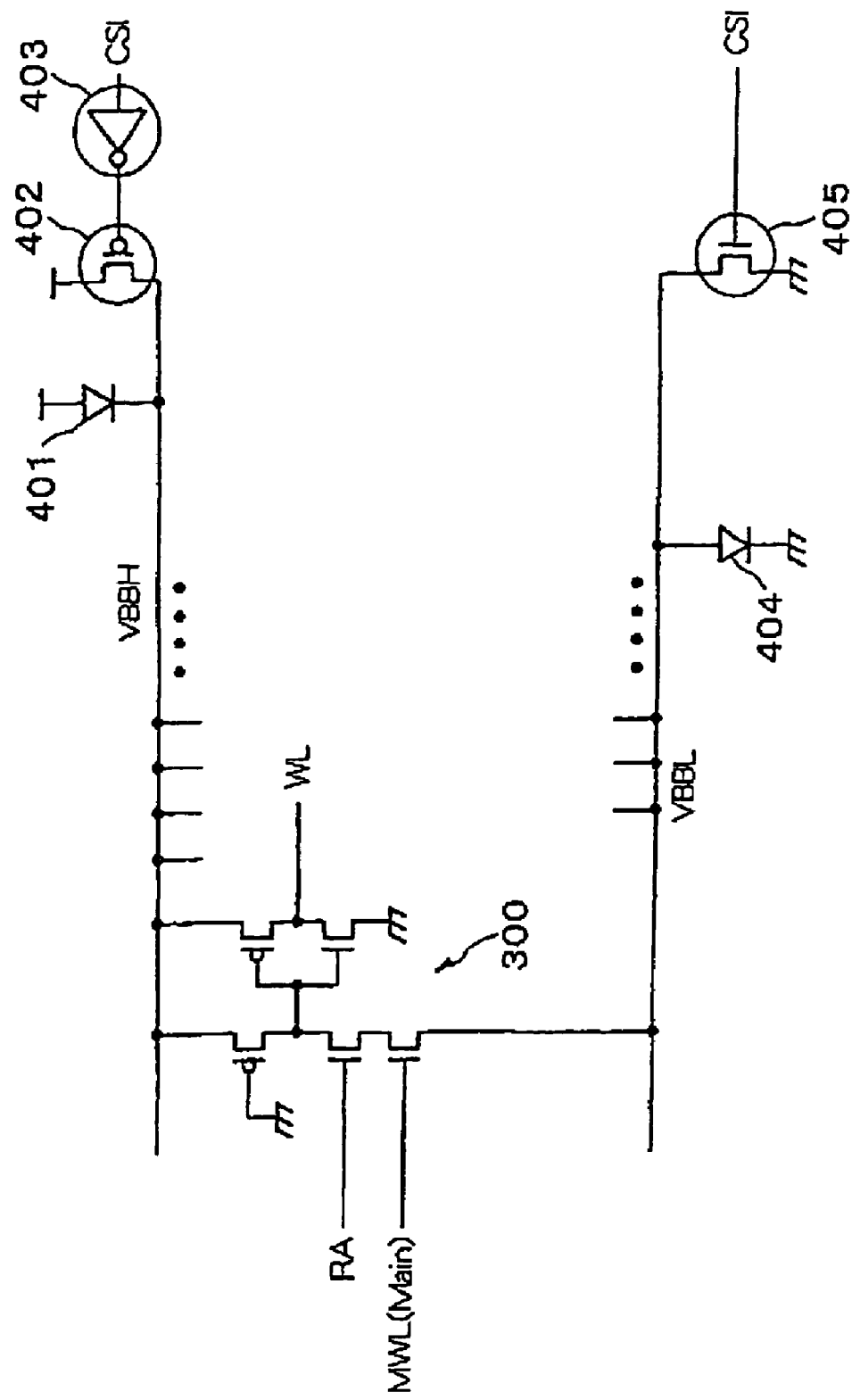
FIG. 11 is a view showing a configuration (a power supply circuit and a ground supply circuit for a cell array block) of a semiconductor memory device in accordance with a third embodiment of the present invention.

As shown in FIG. 11, in this third embodiment, a power supply circuit for supplying the power HVD to the above-described driver 300 shown in FIG. 9 comprises a diode 401, a p-channel transistor 402, and a CMOS-configured inverter 403. A gate threshold voltage of MOS transistors forming the p-channel transistor 402 and the inverter 403 is set higher than a gate threshold voltage of the MOS transistors forming the driver 300. A ground supply circuit for supplying the ground voltage to the driver 300 comprises a diode 404 and an n-channel transistor 405 having a high gate threshold voltage.

An anode of the diode 401 is connected to the power supply, while a cathode thereof is connected to the power line (HVDD). A source of the p-channel transistor 402 is connected to the power supply, while a drain thereof is connected to the power line (HVDD). The internal chip select signal CSI is inverted by the inverter 403 and then supplied to the gate of the p-channel transistor 402.

An anode of the diode 404 is connected to a ground line (VBBL), while a cathode thereof is connected to the ground. A source of the n-channel transistor 405 is connected to the ground, while a drain thereof is connected to the ground line (VBBL). The internal chip select signal CSI is supplied to the gate of the n-channel transistor 405. In FIG. 11, only one of the driver 300 is shown. Notwithstanding, the same number of this driver as the number of the blocks are provided which are commonly connected to the same power line (VBBH) and the same ground line (VBBL), wherein those drivers are provided for every rows corresponding to the word lines.

The following descriptions will concern the operations of this embodiment.

If the internal chip select signal CSI is in the high level, and the operation state is the refresh operation state in the stand-by mode, then the low level is supplied to the gate of the p-channel transistor 402, whereby this transistor turns ON. The high level of the internal chip select signal CSI is supplied to the gate of the n-channel transistor 405, whereby this transistor also turns ON. Accordingly, the power voltage and the ground voltage are supplied to the driver 300 through the p-channel transistor 402 and the n-channel transistor 405, whereby this driver is driven.

In contrast, if the internal chip select signal CSI is in the low level, and the operation state is in the interval between the refresh operations, then the p-channel transistor 402 and the n-channel transistor 405 turn OFF. In this case, the power VBBH is clamped at a potential which is lower than the power potential by a barrier potential Vf of the diode 401. The ground VBBL is clamped at a potential which is higher than the ground potential by a barrier potential Vf of the diode 404.

The power VBBH and the ground VBBL are clamped to prevent any generation of operation currents due to noises such as power bump and coupling, thereby preventing any charge/discharge currents due to noises for very refresh operations. This also stabilizes the potentials of the internal nodes of the driver 300 for preventing any erroneous selections to the word lines.

If the internal chip select signal CSI is in the low level, then the p-channel transistor 402 and the n-channel transistor 405 turn OFF. Since, however, the gate threshold voltages of those transistors are set high to suppress the sub-threshold current of those transistors for effectively breaking down the leak paths between the driver 300 in the cell array block and the power and ground. Accordingly, the leakage of current of this driver 300 is effectively reduced.

In accordance with this third embodiment, the leak path between the cell array block which generates a large leakage of current and the power and ground is broken down, resulting in an extremely effective reduction to the leakage of current of the system of circuits associated with the refresh operations.

Potentials of the power line and the ground line are clamped by the diodes for stabilizing the state of the circuits even the leak path is broken down, resulting in no generation of the unnecessary operation currents and no malfunctions.

The first through third embodiments of the present invention have been described above. The present invention should not be limited to those embodiments, but includes any design change in the context of the subject of the present invention.

For example, in accordance with the above-described configuration shown in FIG. 6 of the first embodiment, the leak paths of the NAND-gate 30D and the inverter 30E are broken down in addition to the delay circuit (inverter chain) comprising the inverters 30A~30C. There is no need of the limitation to this configuration. It is also possible that the leak paths of the inverters 30A~30C only which form the delay circuit are broken down, thereby effectively reducing the leakage of current of the inverter chain having a number of the leak paths. This configuration also reduces the load to the internal chip select signal CSI, thereby making it easy to ensure the timing margins over the control.

In accordance with the above-described configuration shown in FIG. 4 of the first embodiment, the leak paths of the comparators 3A, and 4A are broken down by the n-channel transistors 3C, 4B. It is not unnecessary to limit the configuration to this. For example, it is possible to leave a small leak path in order to reduce the power of those comparators but not to zero. For example, in parallel to the n-channel transistor 3C, an n-channel transistor is provided which generates a larger leakage of current by about ten times than the leakage of current (sub-threshold current) of this transistor.

The formation of the reduced leak path reduces the leakage of current and stabilizes the operations of the comparators in case of the short interval time period. The above-described small leak path (for example, leak path higher by ten times than a leakage of current of the n-channel transistor 3C) may be formed by applying an intermediate voltage to a gate of the n-channel transistor which is connected in parallel to the n-channel transistor 3C.

Needless to say, the semiconductor memory device in accordance with each of the above-described embodiments may be formed on a single chip. It is also possible to realize the device in the form of hybrid IC (integrated circuit), wherein the circuit comprises plural function blocks, each of which is formed on each separate chip. The technical concept of this invention may include such a configuration that a memory chip is supplied with a variety of control signals from a control chip provided outside the memory chip.

INDUSTRIAL APPLICABILITY

In accordance with this invention, the following effects can be obtained.

Namely, the leak breaking means is provided for breaking the leak path between the system of circuits associated with the refresh operations and either the power source or the ground in the interval of time period of the refresh operations, thereby effectively reducing the consumption of current by the system of circuits associated with the refresh operations.

The leak breaking means comprises the switch circuit inserted into the leak path and the control circuit for controlling the switch circuit to be in the OFF-state in the interval of time period, thereby breaking down the leak path between the system of circuits associated with the refresh operations and either the power source or the ground in the interval of time period.

The switch circuit comprises the MOS transistor having the gate threshold voltage which is higher than transistors forming the system of circuits associated with the refresh operations for effectively breaking down the leak path.

The system of circuits associated with the refresh operations receives a reduced power voltage for effective reductions to the consumption of current including an operating current by this system of circuits.

The system of circuits associated with the refresh operations comprise MOS transistors having lower gate threshold voltages adopted to the reduced power voltage in order to reduce the power voltage without reducing the operating speed of this system of circuits.

The system of circuits associated with the refresh operations comprise a transistor, which forms a critical path and has a high gate threshold voltage for reducing the leakage of current without reducing the operating speed of this system of circuits.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A semiconductor memory device configured to automatically refresh data stored in memory cells, said device comprising:
    a switch circuit inserted into a leak path between a system of circuits associated with refresh operations and either a power source or a ground; and
    a control circuit for controlling said switch circuit to be in an OFF-state in an interval time period between refresh operations for breaking down said leak path and also controlling said switch circuit to be in an ON-state prior to said refresh operation, so that operations of a power system and a control system are previously activated for subsequent start of internal operations for said refresh.

2. The semiconductor memory device as claimed in claim 1, wherein the switch circuit includes an MOS transistor having a gate threshold voltage which is higher than transistors forming the system of circuits associated with the refresh operations.

3. The semiconductor memory device as claimed in claim 1, wherein a power voltage to the system of circuits associated with the refresh operations is reduced.

4. The semiconductor memory device as claimed in claim 1, wherein the system of circuits associated with the refresh operations includes MOS transistors having lower gate threshold voltages adapted to the reduced power voltage.

5. The semiconductor memory device as claimed in claim 1, wherein the system of circuits associated with the refresh operations includes a transistor, which forms a critical path and has a gate threshold voltage lower than a transistor forming a non-critical path.

6. The semiconductor memory device as claimed in claim 1, wherein the control circuit delays a chip select signal for generating an internal chip select signal so as to break down the leak path based on the internal chip select signal when the chip select signal for switching between a stand-by mode and an active mode is transitioned from an activated state into an inactivated state.

7. A semiconductor memory device configured to automatically refresh data stored in memory cells, said device comprising:
    a cell array block;
    a boost circuit coupled to said cell array block for generating a boost voltage and a substrate voltage;
    an internal voltage-down circuit coupled to said cell array block for generating a reduced internal voltage; and
    at least one comparator coupled to said boost circuit and said internal voltage-down circuit, wherein when said at least one comparator is controlled to be in an OFF-state, said boost circuit and said internal voltage-down circuit are controlled to be in an ON-state and thereby the supplying of said boost voltage and said substrate voltage to said cell array block is continued.

8. A semiconductor memory device configured to automatically refresh data stored in memory cells, said device comprising:
    a system of circuits that is controlled in at least one of a stand-by mode and a read-write mode and receives as input an internal chip select signal,
    wherein when the stand-by mode is changed to the read-write mode, a signal setting the mode is transitioned in response to the change of the mode, and an internal chip select signal is changed into an ON-state at a first delay after the transition, and
    wherein when the read-write mode is changed to the stand-by mode, the signal setting the mode is transitioned in response to the change of the mode, and the internal chip select signal is changed into an OFF-state at a second delay, which is longer than the first delay, after the transition.

* * * * *